United States Patent
Bultman

(10) Patent No.: US 6,756,290 B1
(45) Date of Patent: Jun. 29, 2004

(54) METHOD FOR THE PRODUCTION OF A SEMICONDUCTOR DEVICE

(75) Inventor: Jan Hendrik Bultman, Alkmaar (NL)

(73) Assignee: Stichting Energieonderzoek Centrum Nederland, Petten (NL)

( * ) Notice: Subject to any disclaimer, the term of this patent is extended or adjusted under 35 U.S.C. 154(b) by 0 days.

(21) Appl. No.: 10/070,172

(22) PCT Filed: Sep. 1, 2000

(86) PCT No.: PCT/NL00/00613
§ 371 (c)(1),
(2), (4) Date: Jun. 28, 2002

(87) PCT Pub. No.: WO01/24279
PCT Pub. Date: Apr. 5, 2001

(30) Foreign Application Priority Data

Sep. 2, 1999 (NL) .............................................. 1012961

(51) Int. Cl.[7] .................... H01L 21/22; H01L 21/00; H01L 21/44; H01L 21/31
(52) U.S. Cl. .................... 438/549; 438/23; 438/38; 438/44; 438/45; 438/57; 438/98; 438/597; 438/782; 438/783; 438/920
(58) Field of Search ............................. 438/23, 38, 44, 438/45, 98, 597, 782, 783, 920, 57, 549

(56) References Cited

U.S. PATENT DOCUMENTS

| | | | |
|---|---|---|---|
| 4,070,689 A | * | 1/1978 | Coleman et al. ............. 136/255 |
| 4,152,824 A | * | 5/1979 | Gonsiorawski ............... 438/98 |
| 4,321,283 A | * | 3/1982 | Patel et al. ................... 427/74 |
| 4,758,525 A | * | 7/1988 | Kida et al. .................... 438/57 |
| 4,818,337 A | * | 4/1989 | Barnett et al. ............... 136/256 |
| 5,133,809 A | * | 7/1992 | Sichanugrist et al. ........ 136/249 |
| 5,558,723 A | * | 9/1996 | Ufert ........................... 136/244 |
| 5,591,565 A | * | 1/1997 | Holdermann et al. ......... 438/98 |
| 6,268,558 B1 | * | 7/2001 | Kubota ......................... 136/244 |
| 6,552,414 B1 | * | 4/2003 | Horzel et al. ................. 257/655 |
| 2003/0102022 A1 | * | 6/2003 | Fath et al. .................... 136/256 |

FOREIGN PATENT DOCUMENTS

| | | |
|---|---|---|
| DE | 42 17 428 | 6/1993 |
| EP | 0 851 511 | 7/1998 |
| JP | 56-012782 | 4/1981 |
| JP | 61-121326 | 10/1986 |

OTHER PUBLICATIONS

J. Horzel et al., "Novel Method to Form Selective Emitters in One Diffusion Step Without Etching or Masking", 14th European Phtovoltaic Solar Energy Conference, Jun. 30, 1997, Jul. 4, 1997, pp 61–64.

* cited by examiner

Primary Examiner—John F. Niebling
Assistant Examiner—Stanetta Isaac
(74) Attorney, Agent, or Firm—Young & Thompson

(57) ABSTRACT

A method for making a semiconductor device having a pattern of highly doped regions located some distance apart in a semiconductor substrate and regions of low doping located between the highly doped regions. A diffusion barrier material is applied to the semiconductor substrate at the location of the regions of low doping by imprinting with the barrier material in the pattern of the regions of low doping. The doping material is applied after or before imprinting with barrier material so that the highly doped regions are formed essentially between the barrier material in the substrate.

13 Claims, 2 Drawing Sheets

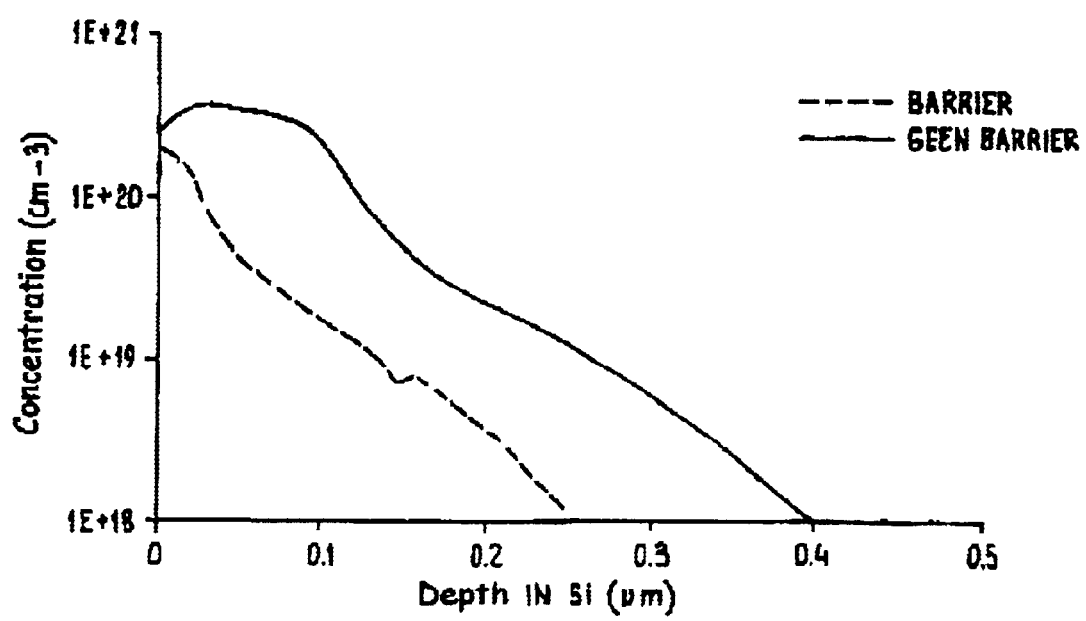

METHOD FOR THE PRODUCTION OF A SEMICONDUCTOR DEVICE

BACKGROUND OF THE INVENTION

The invention relates to a method for making a semiconductor device having a pattern of highly doped regions located some distance apart in a semiconductor substrate and regions of low doping located between the highly doped regions, wherein a doping material is applied to the substrate, at least in the location of the highly doped regions, the substrate is subjected to a diffusion step in which atoms diffuse from the doping material into the substrate, and conducting contacts are made above the highly doped regions.

A method for making a selective emitter in a p-type crystalline Si substrate, with which a diffusion material in the form of a doping paste, such as phosphorus paste, is applied to the substrate by screen printing is described in J. Horzel, J. Szlufcik, J. Nijs and R. Mertens, "A simple processing sequence for selective emitters", 26$^{th}$ PVSC, September 30–October 3; Anaheim, Calif.; 1997 IEEE pp 139–142. The substrate is then dried on a conveyor belt and placed in a diffusion furnace. During the diffusion step the doping materials diffuse into the substrate while diffusion material moves to the regions outside the imprint of doping material via the gas atmosphere in the furnace. Relatively deep diffusion zones having a phosphorus concentration varying from $10^{20}$ at the surface of the substrate to $10^{17}$ at a depth of 0.5 µm below the substrate surface are formed below the imprinted dope material. Shallow diffusion zones having a low phosphorus concentration, varying from $10^{19}$ at the substrate surface to $10^{18}$ at a depth of 0.2 µm, are formed outside the region of the imprint.

The disadvantage of the known method, in particular in the case of the production of solar cells in which the highly doped regions are arranged in a pattern of a series of parallel tracks or fingers, is that the diffusion between the tracks having a high concentration is highly sensitive to the atmosphere in the diffusion furnace, as a result of which the diffusion method is insufficiently stable as a production process. Furthermore the ratio between the high and low doping is dependent and therefore local doping cannot be adjusted to the optimum. To obtain good contact with the metalization placed on the highly doped regions, which metalization is frequently applied by screen printing, a low surface resistance, and thus as high as possible doping, is desired. For the regions located between the metalization an increase in yield is possible, for example in the case of n-p-type solar cells, by passivation of the surface with thermal $SiO_2$ or PECVD SiN, as a result of which recombination of charge carriers at the surface is counteracted. This increase in yield can be achieved only if the doping is low.

SUMMARY OF THE INVENTION

One aim of the present invention is therefore to provide a method for making a semiconductor device, in particular a solar cell, with which regions of high and low doping can be applied efficiently in accurately determined positions on the substrate. A further aim of the invention is to provide a method with which the concentrations of the doping material in the regions of high and low doping can be adjusted relatively independently of one another.

To this end the method according to the invention is characterized in that before the diffusion step a diffusion barrier material is applied to the substrate at the location of the regions of low doping by imprinting with the barrier material in the pattern of the regions of low doping.

During the diffusion step, which usually will be carried out at temperatures of approximately 900° C., the substrate regions located beneath the barrier material are shielded by the latter from the diffusion material applied to the neighboring regions. As a result the concentration in the regions of low doping can be freely adjusted accurately and independently of the concentration in the highly doped regions. Furthermore, with the method according to the invention a single screen printing step and a single drying step can suffice.

It is possible first to apply the doping material to the substrate as a uniform layer, for example by spraying, and then to print the barrier material by means of a printing technique onto the regions of the substrate with low doping, after which the diffusion step is carried out. In this embodiment the barrier material can delay the diffusion of the underlying diffusion material or it can have etching properties, so that the underlying diffusion during the diffusion step is etched out of the substrate. A barrier material which has etching properties is, for example, ZnO.

Alternatively, according to the invention the barrier material is first applied by screen printing, stencil printing, offset printing or tampon printing or using other printing techniques known per se to those regions of the substrate which are to have low doping. The doping material can then be applied as a single layer by spraying, spinning, immersing, vapor deposition or from the gas phase (such as, for example, by means of $POCl_3$ gas in a crystal tube) on top of the substrate and on top of the barrier material.

Although this is not to be preferred from the production standpoint, the doping material can also be printed selectively onto the regions of the substrate for high doping, before or after applying the barrier material. The barrier material is, for example, a dielectric material such as $Si_3N_4$, $SiO_2$ or $TiO_2$, to which an n-type doping material, such as phosphorus (P), arsenic (As), antimony (Sb) or bismuth (Bi) can have been added, or a p-type doping material such as boron (B), aluminum (Al), gallium (Ga), indium (In) or thallium (Th). This material is printed onto the substrate in paste form and then sintered at temperatures between 200° C. and 1000° C.

Following the diffusion step the surface resistance in the highly doped regions is for example, between 10 and 60 ohm square, for a concentration of doping atoms of between $10^{18}$ $cm^{-3}$ and $10^{21}$ $cm^{-3}$, for a diffusion depth beneath the substrate surface of between 0.1 µm and 0.5 µm. The surface resistance of the regions with low doping is between 40 ohm and 600 ohm square, for a concentration of doping atoms of between $10^{17}$ $cm^{-3}$ and $10^{21}$ $cm^{-3}$, for diffusion depth of between 0.1 µm and 0.5 µm.

BRIEF DESCRIPTION OF THE DRAWINGS

A few embodiments of the method according to the present invention will be explained in more detail by way of example with reference to the appended diagrammatic drawing. In the drawing:

FIG. 5 shows a concentration profile of a semiconductor device produced according to the invention.

DESCRIPTION OF THE PREFERRED EMBODIMENTS

Figure 1:
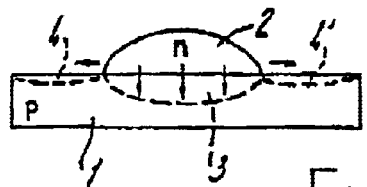
FIG. 1 shows a diagrammatic representation of a method according to the prior art.

FIG. 1 shows a p-type substrate consisting of, for example, silicon doped with n-type atoms. A doping material in the form of a paste, such as a phosphorus paste, is applied by means of screen printing to the substrate 1 above those regions of the substrate 1 which are to have high doping. Following a diffusion step at approximately 900° C. in a diffusion furnace there are highly doped regions 3 and regions 4, 4' of low doping, formed by lateral diffusion from the phosphorus paste 2 via the atmosphere in the diffusion furnace, in substrate 1.

Figure 2A:
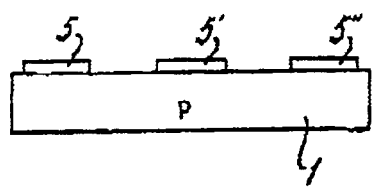
FIGS. 2a, 2b and 2c show a first embodiment of a method according to the present invention using a uniform layer of doping material.
Figure 2B:
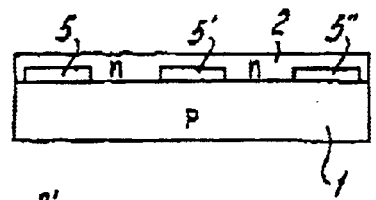
Figure 2C:
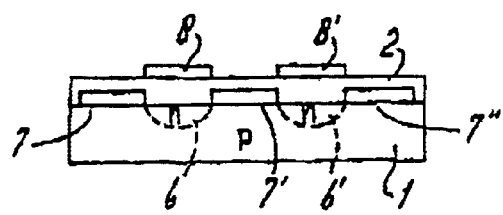

FIG. 2a shows a first step of the method according to the invention, in which a barrier material 5, 5', 5" is applied by means of a printing technique, such as, for example, screen printing, to the p-type crystalline silicon substrate 1 above those regions of the substrate 1 which are to have low doping. The barrier material 5–5" comprises, for example, a dielectric material such as $Si_3N_4$, $SiO_2$ or $TiO_2$ in paste form. After imprinting the paste the barrier material 5–5" is sintered at a temperature between 200° C. and 1000° C. The doping material 2 is then applied uniformly over the substrate 1 and over the barrier material 5–5", as shown in FIG. 2b. The doping material can be applied in very many different ways, for example in the form of an organic molecule (for example triethyl phosphate) or in the form of phosphoric acid. The doping material 2 can be applied by means of spraying, spinning, immersion, vapor deposition or from a gas phase.

The semiconductor device according to FIG. 2b is then placed in a diffusion furnace and subjected to a diffusion step at, for example, approximately 1000° C. As a result of this the n-type atoms diffuse from the doping material 2 into the substrate 1, so that highly doped regions 6, 6', which are located between regions 7, 7', 7" of low doping, are formed in the substrate 1. The regions 7, 7', 7" of low doping are located beneath the barrier material 5–5". Finally, conducting contacts 8, 8', for example consisting of aluminum, are applied, likewise by means of a printing technique, to the doping material 2 on top of the highly doped regions 6, 6'. However, it is also possible to etch away the doping material 2 and the barrier material 5–5" after the diffusion step in FIG. 2b and then to apply a passivating layer consisting of, for example, $SiO_2$ or PECVD SiN over the substrate 1.

Figure 3A:
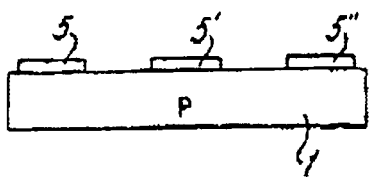
FIGS. 3a, 3b and 3c show an alternative embodiment of a method according to the invention with selective application of the doping material.

FIG. 3a shows an embodiment with which the barrier material 5–5" is first of all printed on the substrate 1 in the desired pattern of regions of low doping and highly doped regions, after which the n-type doping material is applied between the barrier material 5–5".

Figure 3B:
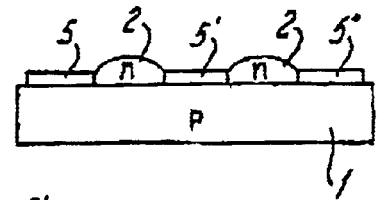
Figure 3C:
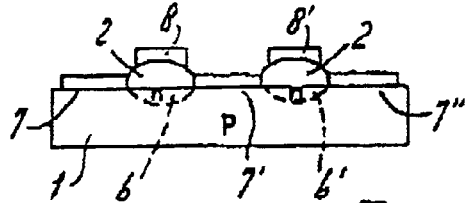

After carrying out a diffusion step in FIG. 3b, the metal contacts are applied at 8, 8' to the doping material 2 above the highly doped regions 6, 6' by a printing technique.

It is possible to add an etching agent to the barrier material 5–5" in the embodiments according to FIG. 2a–FIG. 3c in order to etch away any doping material that has diffused beneath the barrier material.

Figure 4A:
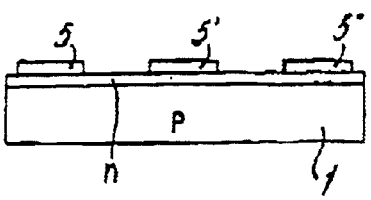
FIGS. 4a, 4b and 4c show an embodiment of the method according to the invention where the barrier material has etching properties
Figure 4B:
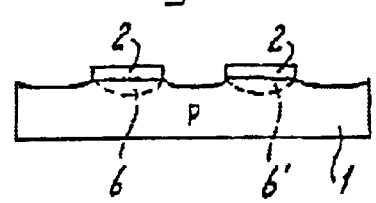
Figure 4C:
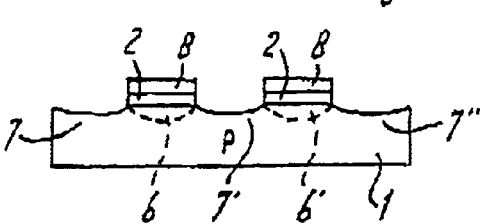

FIG. 4a shows an embodiment with which the doping material 2 is first applied over the substrate 1, after which the barrier material 5–5" is deposited in the desired pattern onto the doping material 2 by imprinting. In this case the barrier material can comprise an etching agent such as, for example, ZnO. During the diffusion step, which is carried out in FIG. 4b, the etching agent from the barrier material will etch away the diffusion regions located beneath this, so that the highly doped regions 6, 6' remains in the substrate in positions where the barrier material 5–5" is absent. Metal contacts 8, 8' can then be applied above the highly doped diffusion regions 6, 6', as shown in FIG. 4c.

This method has the advantage that an optical difference which can be used when aligning the metalization pattern is produced between the positions of the barrier material and neighboring locations. Furthermore, reduced reflection can be obtained with the construction according to FIG. 4c.

It is pointed out that although the method has been described with reference to a p-type substrate and an n-type doping material the method is also suitable for use with n-type substrates with p-type doping material.

Finally, FIG. 5 shows a plot of the concentration against the depth below the substrate surface for a semiconductor device produced in accordance with the present invention. The process conditions for the production of the semiconductor device having the concentration profile according to FIG. 5 were as follows:

The barrier layer was applied from a print paste which was sintered in air at approximately 400° C. This leads to a layer of approximately 1 μm thick $SiO_2$ of low porosity (<80% volume of $SiO_2$). It is important that the paste shows few cracks in order to achieve a maximum gain in efficiency. Partial coverage of the wafer with a barrier layer leads to a lower efficiency but not to short-circuiting of the cell, as is the case when a selective emitter is made with the aid of a resist to protect the locations where a highly doped emitter is needed.

After applying the barrier layer, a phosphorus-containing layer was applied by spin coating using a phosphorus source in the liquid phase. Diffusion into the wafer was then carried out at 900° C. for 10 minutes, which led to the pattern below the barrier layer as is indicated in FIG. 5.

To make cells, silver lines with a width of approximately 100 μm are then printed within the area previously etched by the barrier layer. The size of this etched area has been chosen to be relatively large to prevent the risk of short-circuiting with the regions of low doping. This etched area is at least 150 μm wide. It can be seen from FIG. 5 that the concentration of donor atoms in the highly doped regions 6, 6' is appreciably higher and extends over a greater depth than the concentrations of doping material in regions below the barrier material 5–5". The low donor concentrations at the surface, as are shown in FIG. 5, are outstandingly suitable for surface passivation. This can lead to a significant rise in efficiency of the order of 5%, relative.

What is claimed is:

1. A method of making a semiconductor device having a substrate with a pattern of highly doped regions and lightly doped regions between the highly doped regions, the method comprising the steps of:

applying a substantially continuous layer of doping material to the substrate;

creating the highly doped regions and the lightly doped regions in the substrate by diffusing dopant atoms from the doping material into the substrate;

providing conducting contacts above the highly doped regions; and before the diffusing step, imprinting a diffusion barrier material on the substrate substantially exclusively in the regions that are to be the lightly doped regions.

2. The method of claim 1, wherein the imprinting step is before the step of applying the layer of doping material.

3. The method of claim 1, wherein the imprinting step is after the step of applying the layer of doping material.

4. The method of claim 1, wherein the diffusion barrier material is a dielectric material in paste form and, after the imprinting step, further comprising the step of sintering the dielectric material.

5. The method of claim 1, further comprising the step of adding a dopant to the diffusion barrier material.

6. The method of claim 1, further comprising the steps of adding an etchant to the diffusion barrier material, and etching the substrate adjacent to the diffusion barrier material.

7. The method of claim 1, wherein the highly doped regions have a surface resistance of 10 to 60 ohms per square and the regions between the highly doped regions have a surface resistance of 30 to 500 ohms per square.

8. The method of claim 7, wherein the highly doped regions having a dopant concentration of $10^{18}$ cm$^{-3}$ to $10^{21}$ cm$^{-3}$ and a diffusion depth of 0.1 $\mu$m to 0.5 $\mu$m, and wherein the regions between the highly doped regions having a dopant concentration of $10^{17}$ cm$^{-3}$ to $10^{21}$ cm$^{-3}$ and a diffusion depth of 0.1 $\mu$m to 0.5 $\mu$m.

9. The method of claim 1, wherein the diffusing step is carried out at approximately 900° C.

10. A method of making a semiconductor device having a substrate with a pattern of highly doped regions and lightly doped regions between the highly doped regions, the method comprising the steps of:

imprinting a diffusion barrier material on the substrate substantially exclusively in the regions that are to be the lightly doped regions, the diffusion barrier material being a dielectric material in paste form;

sintering the diffusion barrier material;

applying a substantially continuous layer of doping material to the substrate and the sintered diffusion barrier material;

creating the highly doped regions and the lightly doped regions by diffusing dopant atoms from the doping material into the substrate; and providing conducting contacts on the layer of doping material above the highly doped regions.

11. The method of claim 10, wherein the sintering step is carried out at 200° to 1000° C.

12. The method of claim 10, wherein the diffusing step is carried out at approximately 1000° C.

13. A method of making a semiconductor device having a substrate with a pattern of highly doped regions and lightly doped regions between the highly doped regions, the method comprising the steps of:

applying a substantially continuous layer of doping material to the substrate;

imprinting a diffusion barrier material on the layer of doping material substantially exclusively in the regions that are to be the lightly doped regions, the diffusion barrier material being a dielectric material in paste form having an etching agent therein;

creating the highly doped regions and the lightly doped regions by diffusing dopant atoms from the doping material into the substrate and, during this diffusing step, etching the substrate in the lightly doped regions; and providing conducting contacts on the layer of doping material above the highly doped regions.

* * * * *